(12) United States Patent
Chu et al.

(10) Patent No.: US 11,982,019 B2
(45) Date of Patent: May 14, 2024

(54) CRYSTAL GROWTH DOPING APPARATUS AND CRYSTAL GROWTH DOPING METHOD

(71) Applicant: GlobalWafers Co., Ltd., Hsinchu (TW)

(72) Inventors: Yu-Chih Chu, Hsinchu (TW);
Tang-Chi Lin, Hsinchu (TW);
Han-Sheng Wu, Hsinchu (TW);
Hsien-Ta Tseng, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 237 days.

(21) Appl. No.: 17/826,359

(22) Filed: May 27, 2022

(65) Prior Publication Data
US 2023/0042128 A1    Feb. 9, 2023

(30) Foreign Application Priority Data

Aug. 5, 2021    (TW) .................................. 110128823

(51) Int. Cl.
C30B 15/04    (2006.01)
C30B 11/04    (2006.01)
C30B 35/00    (2006.01)

(52) U.S. Cl.
CPC ............ C30B 35/007 (2013.01); C30B 11/04 (2013.01); C30B 15/04 (2013.01); *Y10T 117/1056* (2015.01)

(58) Field of Classification Search
CPC ....... C30B 11/04; C30B 15/04; C30B 35/007; Y10T 117/1056
See application file for complete search history.

(56) References Cited

U.S. PATENT DOCUMENTS

| 11,795,569 B2 * | 10/2023 | Wu ........................ C30B 29/06 |
| 2011/0132257 A1 * | 6/2011 | Narushima ............. C30B 15/04 117/218 |
| 2015/0252491 A1 * | 9/2015 | Kwon ..................... C30B 15/12 117/214 |
| 2015/0259821 A1 * | 9/2015 | Kwon ..................... C30B 15/12 117/214 |

FOREIGN PATENT DOCUMENTS

| JP | 598694 A | 1/1984 |
| TW | 201713806 A | 4/2017 |
| TW | M546407 U | 8/2017 |

* cited by examiner

*Primary Examiner* — Robert M Kunemund
(74) *Attorney, Agent, or Firm* — Li & Cai Intellectual Property (USA) Office

(57) ABSTRACT

A crystal growth doping apparatus and a crystal growth doping method are provided. The crystal growth doping apparatus includes a crystal growth furnace and a doping device that includes a feeding tube inserted to the furnace body along an oblique insertion direction, and a storage cover and a gate tube that are disposed in the feeding tube. The feeding tube extends from an outer surface thereof to form a placement opening, and the placement opening is recessed from an edge thereof to form an upper recessed portion and a lower recessed portion along the oblique insertion direction. The storage cover includes a storage tank and a handle. When the storage cover is disposed in the gate tube body, the gate tube body is configured to isolate an inner space of the feeding tube from the placement opening.

16 Claims, 14 Drawing Sheets

CRYSTAL GROWTH DOPING APPARATUS AND CRYSTAL GROWTH DOPING METHOD

CROSS-REFERENCE TO RELATED PATENT APPLICATION

This application claims the benefit of priority to Taiwan Patent Application No. 110128823, filed on Aug. 5, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a crystal growth apparatus and a crystal growth method, and more particularly to a crystal growth doping apparatus and a crystal growth doping method.

BACKGROUND OF THE DISCLOSURE

In a crystal growth process, a certain amount of dopant is doped into a silicon crystal melt through a doping device of a conventional silicon wafer crystal growth apparatus, so that the resistivity required for a target silicon crystal can be provided. However, a storage cover that includes dopant therein is mostly taken out from, or placed in the doping device in a manual manner, which may cause contamination of quartz tubes, decreased doping efficiency, and dopant and internal contamination of the doping device.

Furthermore, in the silicon wafer crystal growth apparatus, since a quartz inner tube of the doping device is inclined relative to a crystal growth furnace, when the storage cover is taken out from or placed in the doping device, the storage cover can easily hit and cause damage to a structure of an opening of the doping device.

SUMMARY OF THE DISCLOSURE

In response to the above-referenced technical inadequacies, the present disclosure provides a crystal growth doping apparatus and a crystal growth doping method.

In one aspect, the present disclosure provides a crystal growth doping apparatus, and the crystal growth doping apparatus includes a crystal growth furnace and a doping device. The crystal growth furnace includes a furnace body and a crucible that is disposed in the furnace body and configured to accommodate a melting raw material. The doping device includes a feeding tube, a storage cover, and a gate tube body. The feeding tube is inserted to the furnace body along an oblique insertion direction that is inclined relative to a horizontal direction, in which the feeding tube extends from an outer surface thereof to form a placement opening, and the placement opening is recessed from an edge thereof to form an upper recessed portion and a lower recessed portion along the oblique insertion direction. The storage cover is detachably disposed in the feeding tube, in which the storage cover includes a storage tank and a handle formed on an outer surface of the storage tank. The gate tube body is disposed in the feeding tube, in which the storage cover is detachably disposed in the gate tube body, and when the storage cover is disposed in the gate tube body, the gate tube body is configured to isolate an inner space of the feeding tube from the placement opening.

In another aspect, the present disclosure provides a crystal growth doping method, which is configured to be implemented with a doping device that is inserted in a crystal growth furnace along an oblique insertion direction, in which the crystal growth furnace includes a crucible therein, and the crucible is configured to accommodate a melting raw material, and in which the doping device includes a feeding tube, a gate tube body that is disposed in the feeding tube, and a storage cover that is detachably disposed in the gate tube body, and the feeding tube extends from an outer surface thereof to form a placement opening. The crystal growth doping method includes a gate opening step, a storage cover removing step, a material storage step, a storage cover placement step, a gate closing step, and a doping step. The gate opening step includes having a door opening member enter the feeding tube from the placement opening and abut against a gate tube opening of the gate tube body, the door opening member pushing the gate tube body along the oblique insertion direction such that the gate tube body is moved away from the placement opening of the feeding tube, and having the door opening member engage with the feeding tube. The storage cover removing step includes having a removal member pass through the placement opening so as to hook a handle of the storage cover onto the removal member, and taking the storage cover outside of the feeding tube from the placement opening along the oblique insertion direction. The material storage step includes placing a dopant in the storage cover. The storage cover placement step includes hooking the handle and placing the storage cover into the feeding tube with the removal member. The gate closing step includes separating the door opening member from the gate tube opening of the gate tube body, so as to move the gate tube body along the oblique insertion direction and isolate an inner space of the feeding tube from the placement opening. The doping step includes moving the feeding tube to allow the storage cover to be adjacent to the melting raw material, so that the dopant is heated and vaporized and enters the melting raw material.

Therefore, in the crystal growth doping apparatus and the crystal growth doping method provided by the present disclosure, by virtue of a storage cover being detachably disposed in the feeding tube, and when the storage cover is disposed in the gate tube body, the gate tube body being configured to isolate an inner space of the feeding tube from the placement opening, internal pollution problems of the dopant and the crystal growth doping apparatus can be prevented, and when the dopant is taken out from or placed in the crystal growth doping apparatus, the placement opening of the feeding tube can be prevented from being hit, which may cause the feeding tube to break.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
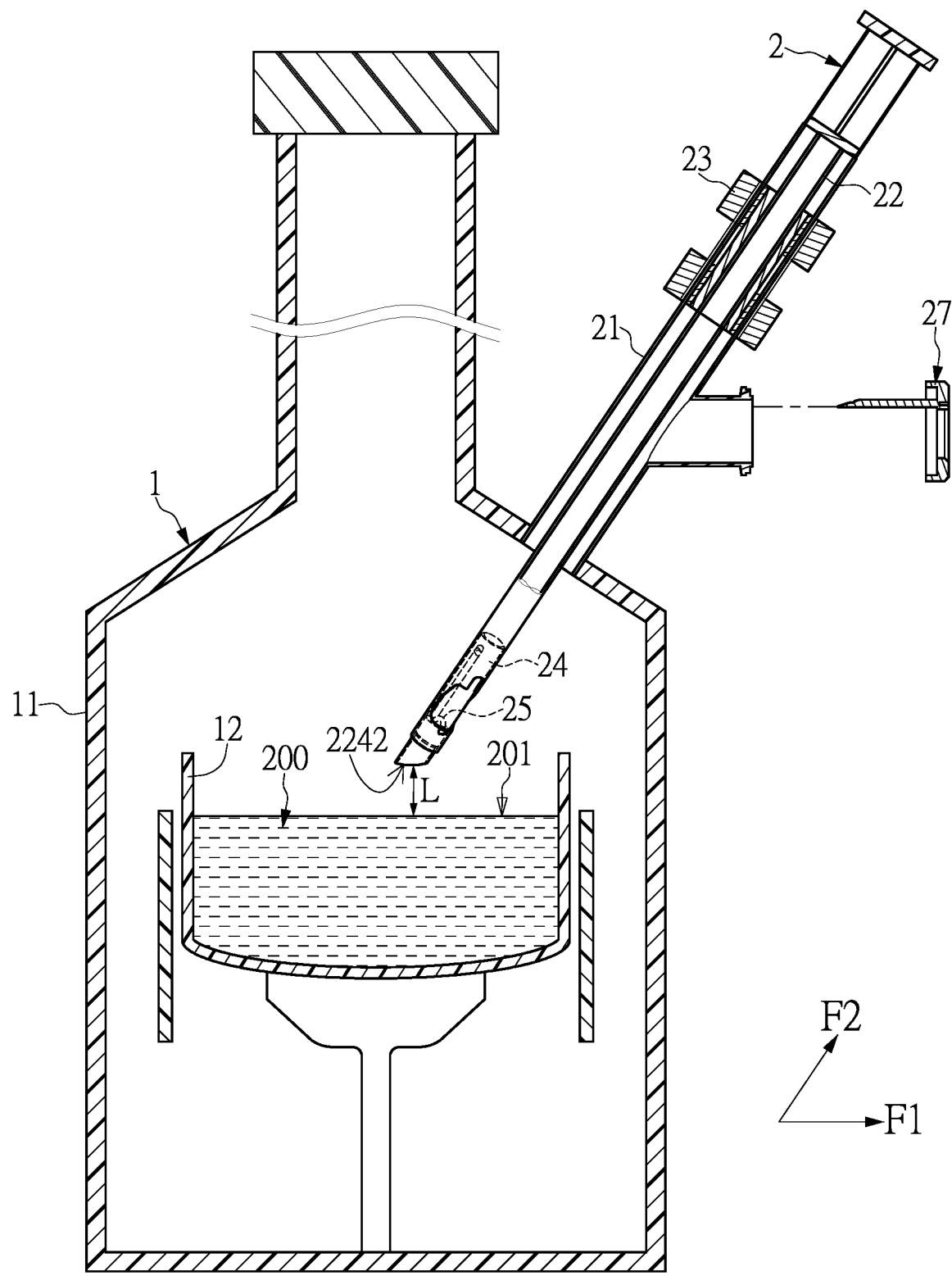
FIG. 1 is a schematic view of a crystal growth doping apparatus according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 14, an embodiment of the present disclosure provides a crystal growth doping apparatus 100 and a crystal growth doping method S100. For ease of understanding the crystal growth doping method S100, the structure of each component of the crystal growth doping apparatus 100 will be described in sequence, and the crystal growth doping method S100 will be described in due course.

As shown in FIG. 1, the crystal growth doping apparatus 100 includes a crystal growth furnace 1 and a doping device 2 that is disposed to the crystal growth furnace 1, and the crystal growth furnace 1 includes a furnace body 11 and a crucible 12 that is disposed in the furnace body 11 and configured to accommodate a melting raw material 200.

It should be noted that, in the present embodiment, the crystal growth furnace 1 is applied in a Czochralski process to perform a crystal growth process, and the crystal growth furnace 1 can be used to produce products such as crystal ingots, crystal rods, or monocrystalline silicon, but the present disclosure is not limited thereto. For example, in other embodiments not shown in the present disclosure, the crystal growth furnace 1 can be applied in a Bridgman-Stockbarger process to perform the crystal growth process.

Figure 12:
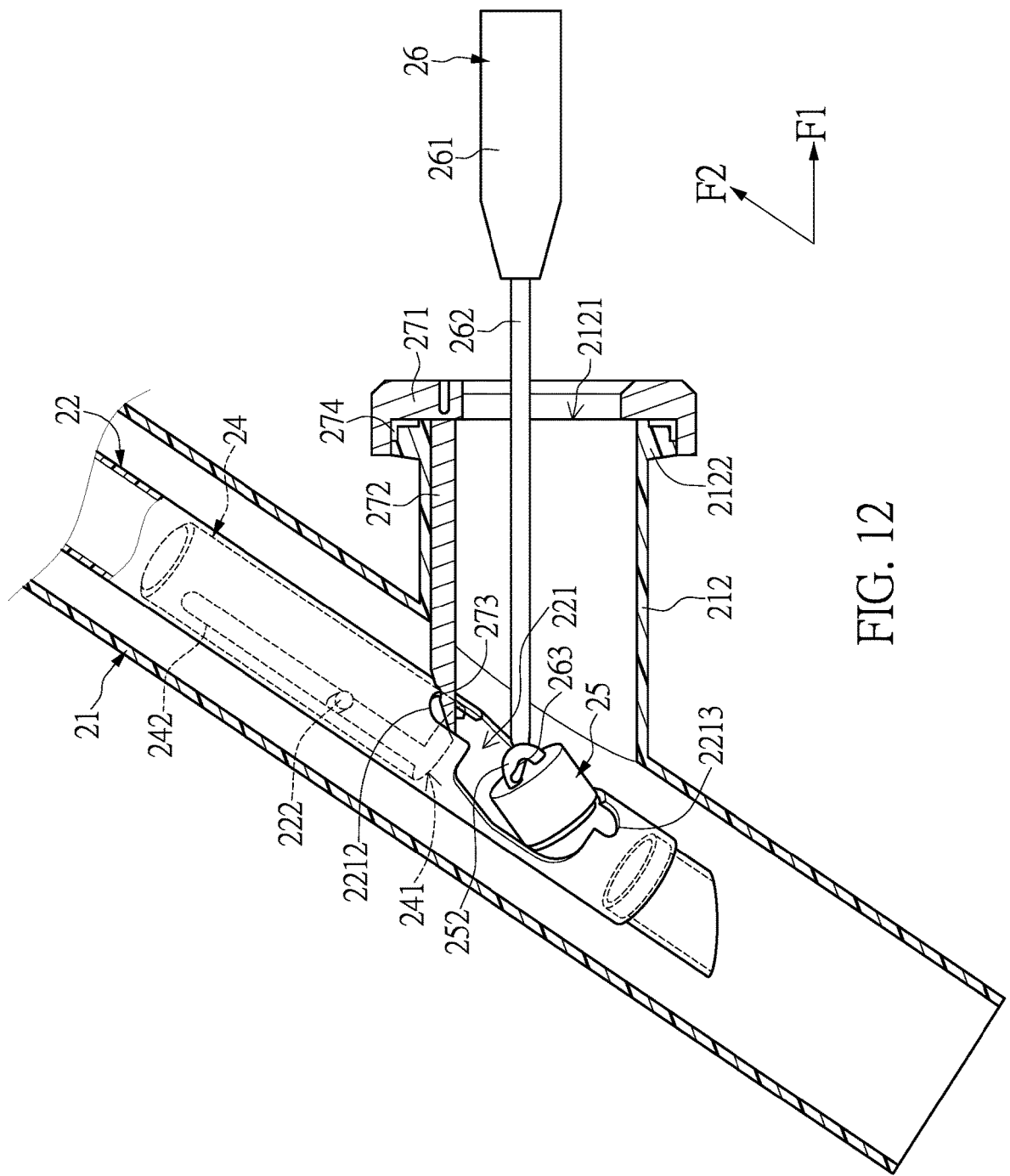
FIG. 12 is a schematic view of a storage cover removing step according to the embodiment of the present disclosure.

As shown in FIG. 1 and FIG. 12, the doping device 2 includes an outer tube 21 which is disposed on the furnace body 11 along an oblique insertion direction F2 that is inclined relative to a horizontal direction F1, a feeding tube 22 that is inserted to the furnace body 11 along the oblique insertion direction F2, a magnetic moving mechanism 23 that is movably mounted on the outer tube 21, a gate tube body 24 that is disposed in the feeding tube 22, a storage cover 25 that is detachably disposed in the feeding tube 22, a removal member 26 that is detachably disposed to the furnace body 11, and a door opening member 27 that is detachably disposed to the furnace body 11.

Specifically, from an outside toward an inside of the doping device 2, the magnetic moving mechanism 23, the outer tube 21, the feeding tube 22, the gate tube body 24, and the storage cover 25 are sequentially disposed to the doping device 2. In addition, relative to the outer tube 21, the storage cover 25, the removal member 26, and the door opening member 27 are detachably mounted or disposed to the outer tube 21 and other elements that are tubular.

It should be noted that an angle between the horizontal direction F1 and the oblique insertion direction F2 is between 30° and 45°, but the present disclosure is not limited thereto. In brief, the angle can be adjusted according to practical requirements.

It should be noted that for ease of illustration, the outer tube 21, the feeding tube 22, the magnetic moving mechanism 23, and the gate tube body 24 are sequentially described herein, then the storage cover 25, the removal member 26, and the door opening member 27 will be described.

Figure 2:
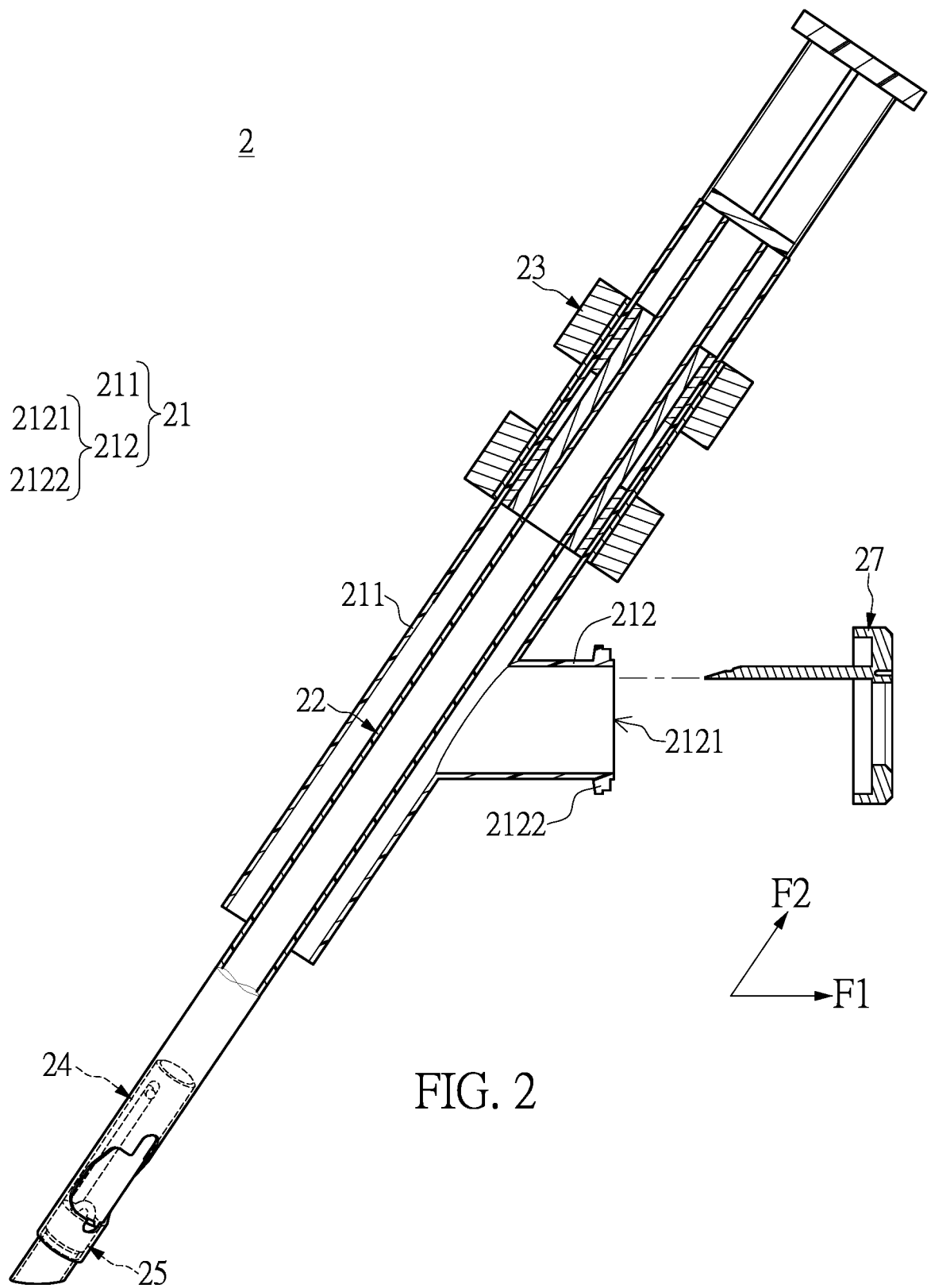
FIG. 2 is a schematic view of a doping device according to the embodiment of the present disclosure.

As shown in FIG. 1 and FIG. 2, the outer tube 21 includes an outer tube body 211 and an operating tube 212 that extends along the horizontal direction F1 from the outer tube body 211, and the operating tube 212 has an operating tube opening 2121 and a surrounding protrusion 2122 which is disposed to the operating tube opening 2121 and located at an end of the operating tube 212 relatively away from the outer tube body 211.

In addition, the operating tube opening 2121 is configured for the storage cover 25 to enter an inside of the outer tube body 211 of the outer tube 21 from an outside of the crystal growth furnace 1, and the surrounding protrusion 2122 is configured for the door opening member 27 to engage thereto, so that the door opening member 27 can be detachably mounted to the surrounding protrusion 2122.

More specifically, in the present embodiment, the operating tube 212 is a flange tube, the operating tube opening 2121 has a flange plate structure (not shown in the figures) that is disposed at an outer edge thereof, and the surrounding protrusion 2122 is formed on a side surface of the flange plate structure relatively away from the outer tube body 211, but the present disclosure is not limited thereto. For example, in other embodiments not shown in the present disclosure, the operating tube 212 can also be a tube of another type (e.g. a spiral tube or a square tube).

Figure 3:
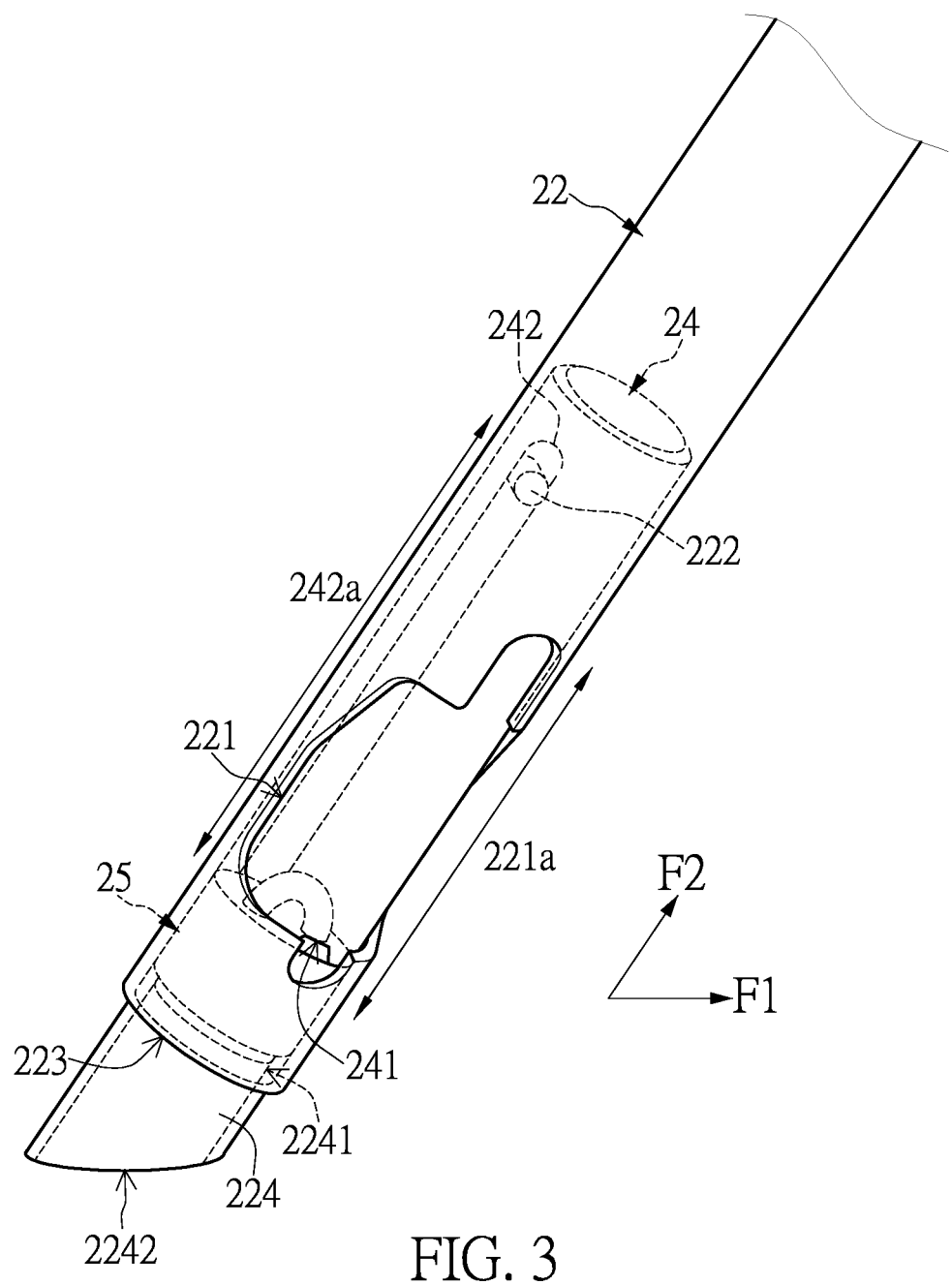
FIG. 3 is a partially exploded view of the doping device according to the embodiment of the present disclosure.

As shown in FIG. 1 to FIG. 3, part of the feeding tube 22 is disposed in the outer tube 21, and part of the feeding tube 22 is disposed in the furnace body 11 and adjacent to the melting raw material 200. In addition, the feeding tube 22 includes a placement opening 221 that extends from an outer surface thereof, a dowel 222 that is formed on an inner side surface of the feeding tube 22, a feeding tube opening 223 that is formed at an end of the feeding tube 22, and an inclined tube 224 that is connected to an inside of the feeding tube 22.

Figure 4:
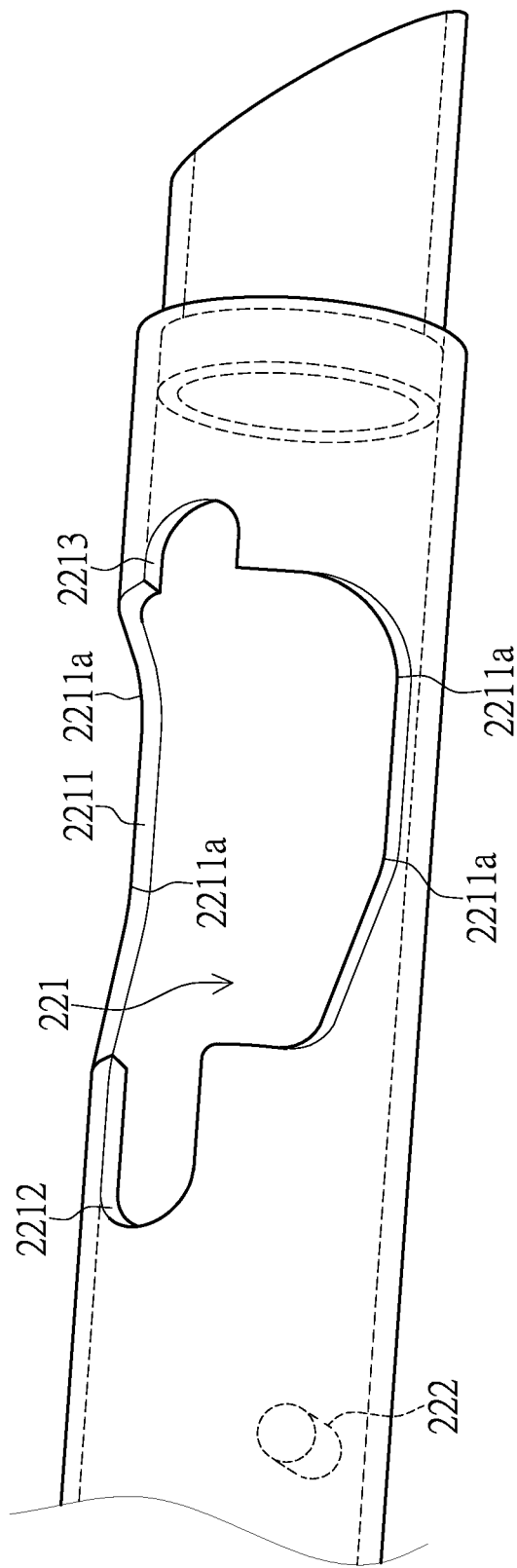
FIG. 4 is a perspective view of an operating tube according to the embodiment of the present disclosure.

It should be noted that, as shown in FIG. 4, the placement opening 221 has a shrinkage groove 2211, an upper recessed portion 2212, and a lower recessed portion 2213, and the upper recessed portion 2212 and the lower recessed portion 2213 are connected to the shrinkage groove 2211. In addition, in the present embodiment, the upper recessed portion 2212 and the lower recessed portion 2213 are respectively half oval and half circular in shape.

Furthermore, the upper recessed portion 2212 and the lower recessed portion 2213 are configured to provide a relatively spacious moving space for the removal member 26, so that the storage cover 25 can be placed in the feeding tube 22 from the shrinkage groove 2211 with the removal member 26 and without the shrinkage groove 2211 being hit.

It should be noted that the placement opening 221 is recessed from an edge thereof to form the upper recessed portion 2212 and the lower recessed portion 2213 along the oblique insertion direction F2, and the shrinkage groove 2211 is located between the upper recessed portion 2212 and the lower recessed portion 2213, but the present disclosure is not limited thereto. For example, in other embodiments of the present disclosure, the shape of the upper recessed portion 2212 and the lower recessed portion 2213 can be adjusted according to practical requirements.

Furthermore, in the present embodiment, the shrinkage groove 2211 has two rounded corners 2211a that are formed on two sides thereof along a direction that is perpendicular to the oblique insertion direction F2, and each of the two rounded corners 2211a is between 120° and 180°. In addition, the shrinkage groove 2211 and the two rounded corners 2211a can be used to increase the structural strength of the feeding tube 22 and effectively decrease the stress that is applied on the feeding tube 22 during operation, but the present disclosure is not limited thereto. For example, in other embodiments not shown in the present disclosure, the shrinkage groove 2211 can also be provided without the two rounded corners 2211a.

It should be noted that, as shown in FIG. 3 and FIG. 4, the dowel 222 and the placement opening 221 are respectively formed at opposite sides of the feeding tube 22, and a distance that is between the dowel 222 and the lower recessed portion 2213 is greater than a distance that is between the dowel 222 and the upper recessed portion 2212. In addition, the dowel 222 can be used to limit a relative position between the gate tube body 24 and the feeding tube 22.

It should be noted that, as shown in FIG. 1 to FIG. 3, the feeding tube opening 223 is adjacent to the lower recessed portion 2213 and near to the crucible 12, and the inclined tube 224 is partially disposed in the feeding tube opening 223. In addition, an outer diameter of the inclined tube 224 is not greater than an inner diameter of the feeding tube 22, the inclined tube 224 has two ends that respectively form a flat tube opening 2241 and an inclined tube opening 2242, and the flat tube opening 2241 is disposed in the feeding tube opening 223.

Specifically, the flat tube opening 2241 is located in the feeding tube 22, and a cross-section of the flat tube opening 2241 is not parallel to a melting surface 201 of the melting raw material 200. In addition, the inclined tube opening 2242 is located outside the feeding tube 22, and a cross-section of the inclined tube opening 2242 is parallel to the melting surface 201.

As shown in FIG. 1, the inclined tube opening 2242 is adjacent to the melting surface 201, and the cross-section of the inclined tube opening 2242 and the melting surface 201 have a vertical distance L there-between, and the vertical distance L is not greater than 5 mm. Furthermore, in the present embodiment, the vertical distance L is preferably between 1 mm and 5 mm, and the vertical distance L is more preferably between 1 mm and 3 mm.

It should be noted that, by virtue of "the cross-section of the inclined tube opening 2242 and the melting surface 201 having a vertical distance L there-between, and the vertical distance L being not greater than 5 mm," the storage cover 25 can be as close as possible to the melting surface 201 and receive more heat energy in a certain period of time, so as to increase the doping efficiency of the crystal growth doping apparatus 100.

Figure 5:
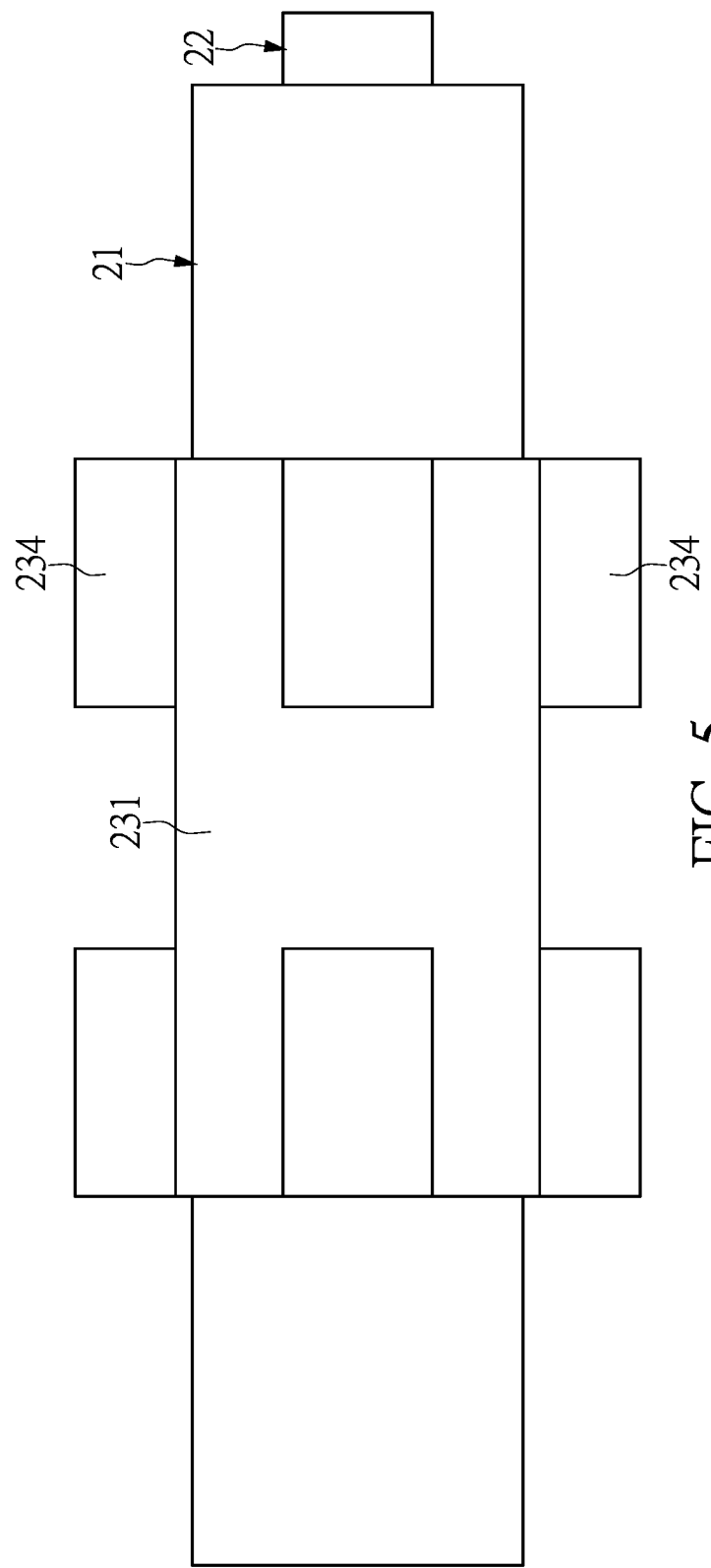
FIG. 5 is a top view of a magnetic moving mechanism according to the embodiment of the present disclosure.
Figure 6:
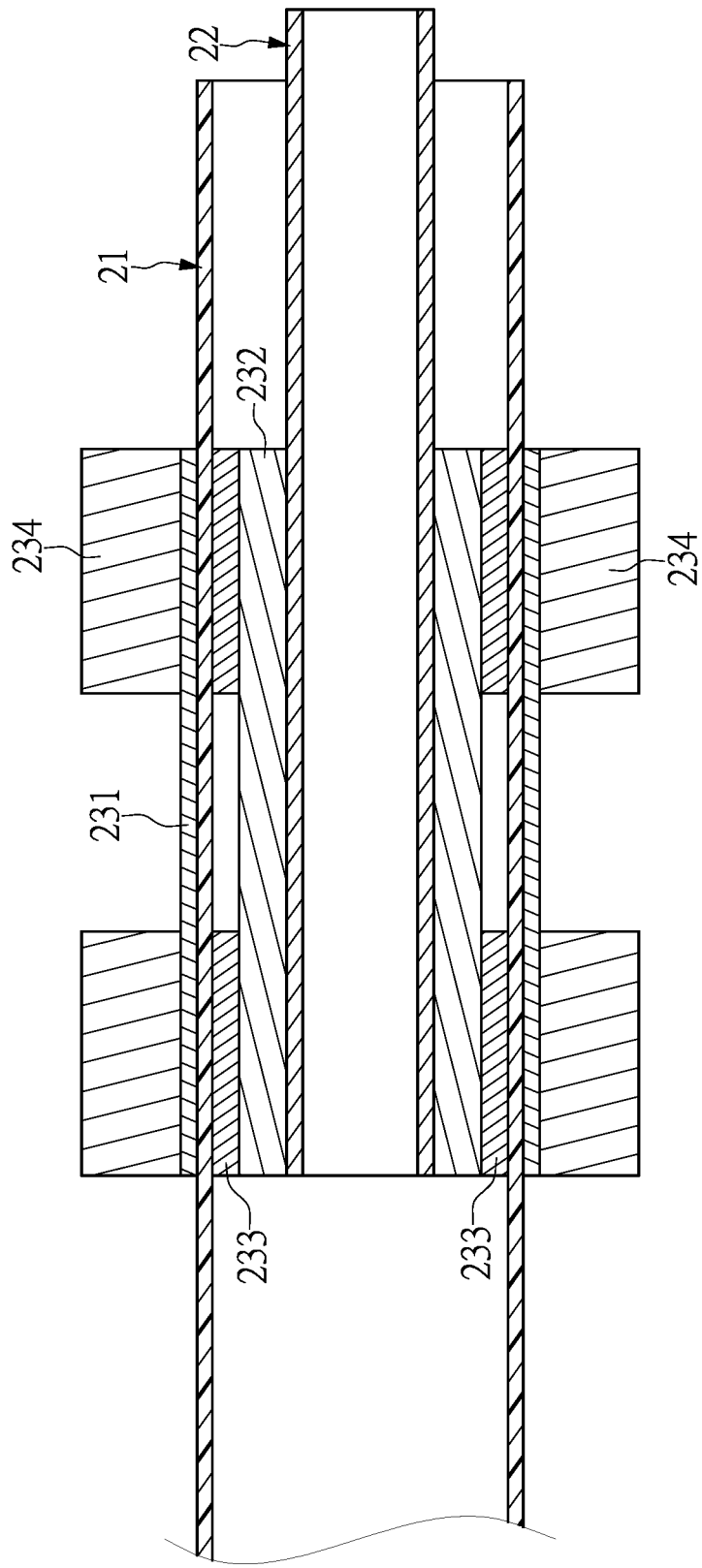
FIG. 6 is a cross-sectional view of the magnetic moving mechanism according to the embodiment of the present disclosure.

As shown in FIG. 1, FIG. 5, and FIG. 6, the magnetic moving mechanism 23 includes an outer magnetic sleeve 231 that is movably disposed on an outer surface of the outer tube 21, an inner magnetic sleeve 232 that is movably disposed on an inner side surface of the outer tube 21, a plurality of adsorbed members 233 that are movably disposed between the inner side surface of the outer tube 21 and the inner magnetic sleeve 232, and a plurality of magnetic members 234 that are disposed on a side surface of the outer magnetic sleeve 231 relatively distant from the outer side surface of the outer tube 21.

In addition, the adsorbed members 233 correspond in position to the magnetic members 234, and the feeding tube 22 is disposed at and abuts against an inner side surface of the magnetic moving mechanism 23.

Specifically, when the feeding tube 22 is disposed in the outer tube 21, the inner magnetic sleeve 232 covers around part of the outer surface of the feeding tube 22, and the adsorbed members 233 are disposed on a side surface of the inner magnetic sleeve 232 relatively distant from the feeding tube 22. In addition, the outer magnetic sleeve 231 covers part of the outer surface of the outer tube 21, and the magnetic members 234 are disposed on the side surface of the outer magnetic sleeve 231 relatively distant from the outer tube 21.

Furthermore, the quantity of the adsorbed members 233 and the quantity of the magnetic members 234 are the same and preferably four, respectively. In the present embodiment, the adsorbed members 233 and the magnetic members 234 can respectively be iron members and magnets.

It should be noted that the magnetic moving mechanism 23 is configured to move the feeding tube 22. Specifically, the magnetic members 234 can be operated outside of the outer tube 21 and moved, so that the feeding tube 22 that is covered by the inner magnetic sleeve 232 can be correspondingly moved. Accordingly, when the feeding tube 22 is operated without opening the crystal growth doping apparatus 100, problems such as pollution can be prevented.

As shown in FIG. 3, the gate tube body 24 forms a gate tube opening 241 on an end thereof, and the gate tube opening 241 is recessed along the oblique insertion direction F2 to form a long groove 242. In addition, in the oblique insertion direction F2, the long groove 242 and the placement opening 221 each have a length, and the length of the long groove 242 is not less than the length of the placement opening 221.

Furthermore, in the present embodiment, the length of the long groove 242 is defined as a long groove length 242a, the length of the placement opening 221 is defined as a placement port length 221a, and a ratio of the long groove length 242a to the placement port length 221a is between 1.3 and 2.

More specifically, the ratio of the long groove length 242a to the placement port length 221a can be between 1.3 and 1.5, 1.5 and 1.8, and 1.8 and 2.0. In the present embodiment, the ratio of the long groove length 242a to the placement port length 221a is preferably between 1.5 and 1.8. Accordingly, the structural strength of the gate tube body 24 still can be maintained to a certain extent when the gate tube body 24 has the long groove 242 formed thereon.

It should be noted that, when the gate tube body 24 is disposed in the feeding tube 22, the gate tube body 24 is configured to isolate an inner space of the feeding tube 22 from the placement opening 221, so that the inside of the feeding tube 22 is isolated from the outside thereof. In addition, as shown in FIG. 3, the dowel 222 can be disposed in the long groove 242, and when the storage cover 25 is not disposed in the feeding tube 22, the dowel 222 engages to an end of the long groove 242 relatively distant from the gate tube opening 241, so that the gate tube body 24 is maintained in the same position for a long time.

Descriptions regarding the outer tube 21, the feeding tube 22, the magnetic moving mechanism 23, and the gate tube body 24 are concluded herein. The storage cover 25, the removal member 26, and the door opening member 27 will be sequentially described next in conjunction with description of the outer tube 21, the feeding tube 22, the magnetic moving mechanism 23, and the gate tube body 24.

Figure 7:
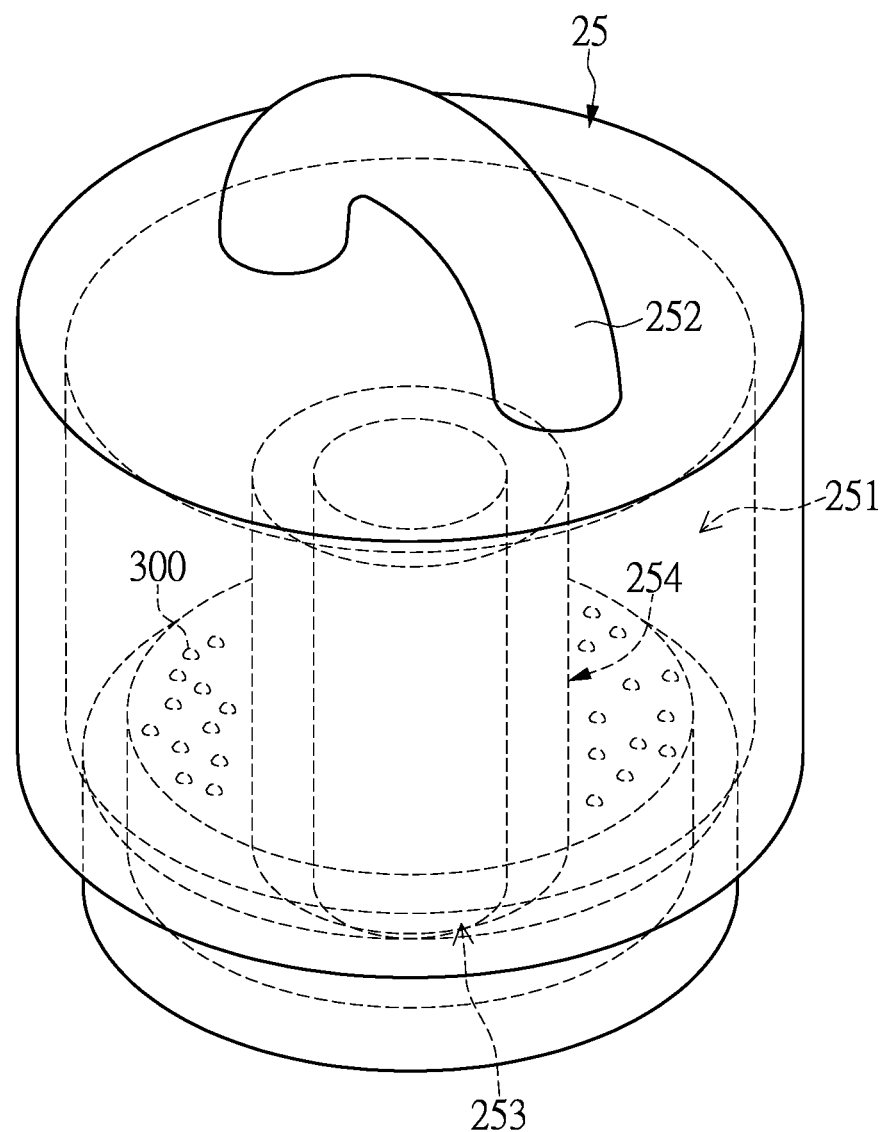
FIG. 7 is a perspective view of a storage cover according to the embodiment of the present disclosure.

As shown in FIG. 7, the storage cover 25 includes a storage tank 251, a handle 252 that is formed on an outer side surface of the storage tank 251, a loading opening 253 that corresponds in position to the handle 252, and a loading tube 254 that is recessed toward an inside of the storage tank 251 from the loading opening 253. In addition, the loading opening 253 is configured for a dopant 300 to enter the storage tank 251, and the loading tube 254 and an inner side wall of the storage cover 25 jointly form the storage tank 251.

Figure 14:
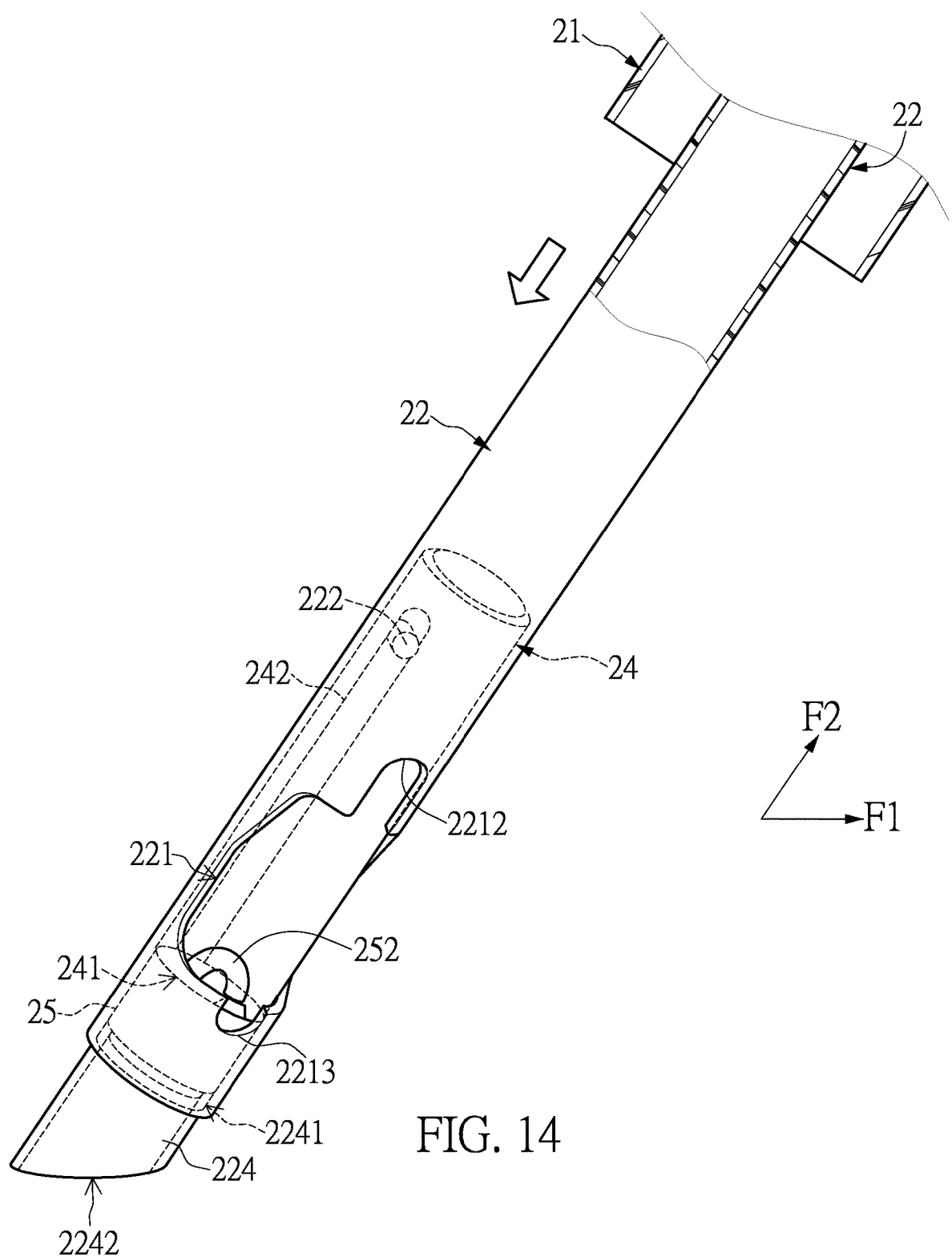
FIG. 14 is a schematic view of a doping step according to the embodiment of the present disclosure.

It should be noted that, as shown in FIG. 7 and FIG. 14, when the storage cover 25 is disposed in the feeding tube 22, the gate tube body 24 is engaged to the dowel 222, and the storage cover 25 is detachably disposed in the gate tube body 24. When the storage cover 25 is disposed in the gate tube body 24, a side surface of the storage cover 25 relatively distant from the handle 252 is detachably disposed to (engages to) the flat tube opening 2241. In other words, the side surface of the storage cover 25 adjacent to the loading opening 253 abuts the flat tube opening 2241.

It should be noted that, as shown in FIG. 1, FIG. 7, and FIG. 14, in the present embodiment, the dopant 300 is solid, and when the storage cover 25 abuts the flat tube opening 2241, the heat emitted by the melting raw material 200 is transmitted to the dopant 300 by thermal radiation and conduction, so that the dopant 300 is heated and vaporized.

In continuation of the above, the vaporized dopant 300 overflows from the loading opening 253 and reaches the melting surface 201 of the melting raw material 200 for doping through the flat tube opening 2241 and the inclined tube opening 2242.

As mentioned above, if a dopant that reaches the melting surface 201 of the melting raw material 200 is solid, the solid dopant is different from the vaporized dopant 300, and a doping apparatus for the solid dopant is different from the crystal growth doping apparatus 100 of the present disclosure.

Figure 8:
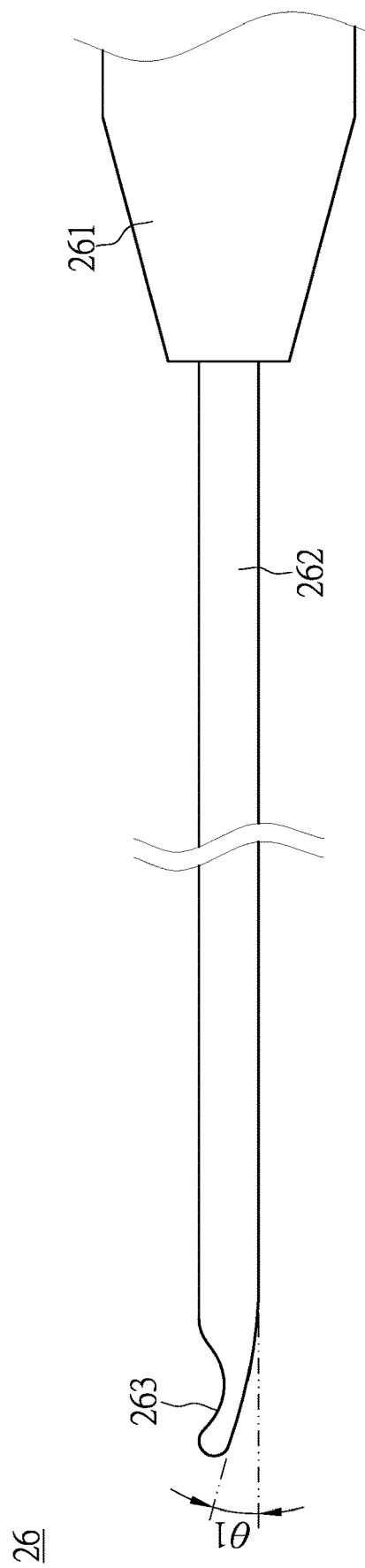
FIG. 8 is a perspective view of a removal member according to the embodiment of the present disclosure.

As shown in FIG. 8, the removal member 26 includes a removal grip 261, a first rod body 262 that is connected to the removal grip 261, and a first recessed portion 263 formed at an end of the first rod body 262 relatively distant from the removal grip 261. In addition, the removal member 26 can be used to enter the placement opening 221 of the feeding tube 22 from the operating tube opening 2121 of the operating tube 212, and the removal member 26 is configured to take out the storage cover 25 from the feeding tube 22 and hook and support the handle 252 with the first recessed portion 263.

It should be noted that, an end of the first rod body 262 is adjacent to the first recessed portion 263, and the end of the first rod body 262 and a length direction of the first rod body 262 have a first oblique angle θ1 there-between that is between 8° and 12°. In addition, in the present embodiment, the first oblique angle θ1 is preferably 10°, but the present disclosure is not limited thereto, and the first oblique angle θ1 is without special limitations. Specifically, the first oblique angle θ1 is located on an opposite side of a bottom surface of the first recessed portion 263, and by virtue of "the end of the first rod body 262 and a length direction of the first rod body 262 having a first oblique angle θ1," the removal member 26 can easily take out the storage cover 25.

Figure 9:
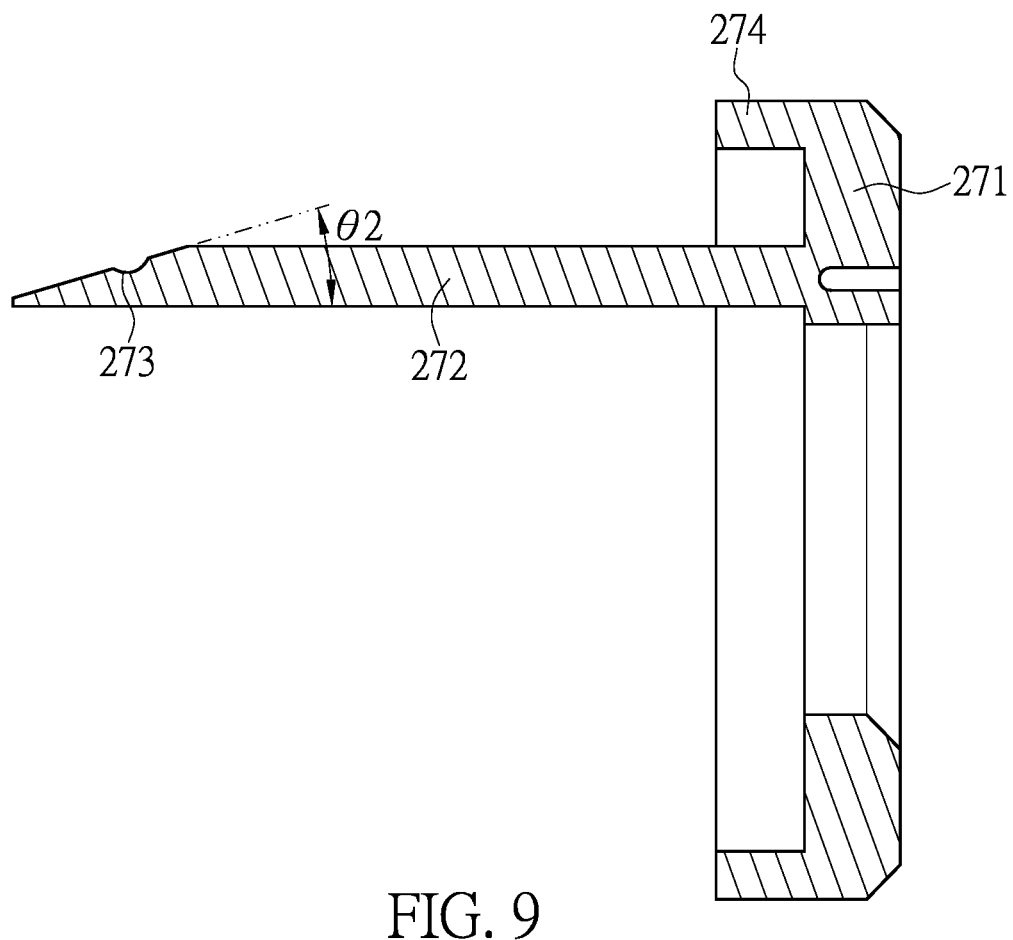
FIG. 9 is a perspective view of a door opening member according to the embodiment of the present disclosure.

As shown in FIG. 9, the door opening member 27 includes a door opening grip 271, a second rod body 272 that is connected to the door opening grip 271, a second recessed portion 273 which is formed at an end of the second rod body 272 relatively distant from the door opening grip 271, and an engagement portion 274 which is located at another end of the door opening member 27 relatively distant from the second recessed portion 273.

Figure 11:
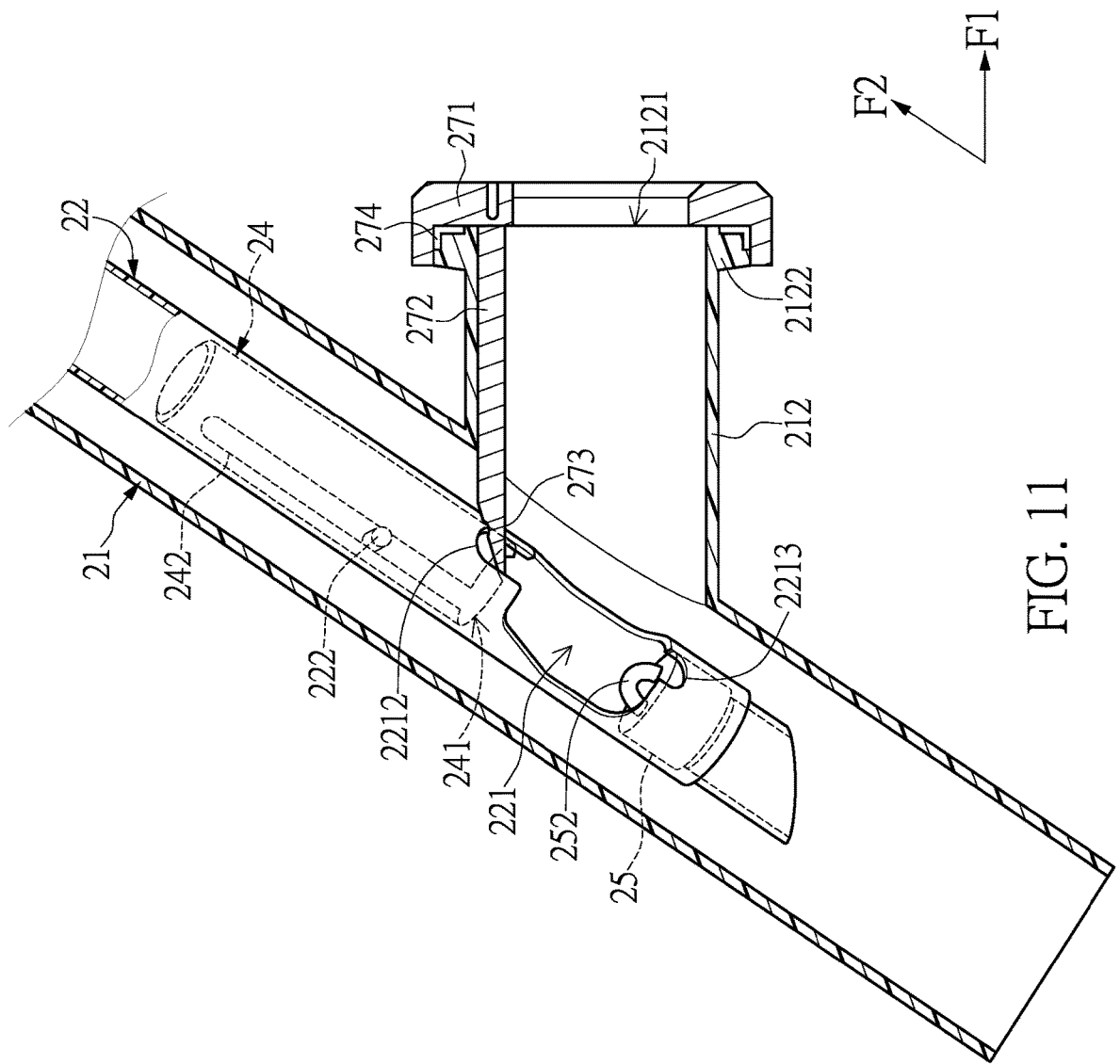
FIG. 11 is a schematic view of a gate opening step according to the embodiment of the present disclosure.

As shown in FIG. 11, the door opening member 27 is configured to enter the gate tube body 24 from the operating tube opening 2121 of the operating tube 212 to detachably abut the gate tube opening 241 of the gate tube body 24 with the second recessed portion 273, then the door opening member 27 is configured to push the gate tube body 24 along the oblique insertion direction F2 so that the gate tube body 24 is moved away from the placement opening 221.

It should be noted that, as shown in FIG. 9, an end of the second rod body 272 is adjacent to the second recessed portion 273, and the end of the second rod body 272 and a length direction of the second rod body 272 have a second bevel angle θ2 there-between that is between 13° and 17°. In addition, in the present embodiment, the second bevel angle θ2 is preferably 15°, but the present disclosure is not limited thereto, and the second bevel angle θ2 is without special limitations.

It should be noted that, in the present embodiment, the door opening member 271 is semi-annular, and the engagement portion 274 is disposed on the door opening member 271. After the door opening member 27 pushes the gate tube body 24 so that the gate tube body 24 is moved away from the placement opening 221, the engagement portion 274 is configured to engage with the operating tube opening 2121 of the operating tube 212, so as to maintain a distance between the gate tube body 24 and the placement opening 221, and the first rod body 262 of the removal member 26 is configured to pass through the door opening member 271 and then enter the placement opening 221 of the feeding tube 22.

Descriptions regarding the crystal growth doping apparatus 100 are concluded herein, and the crystal growth doping method S100 that is implemented with the crystal growth doping apparatus 100 will be described, but the present disclosure is not limited thereto. In other words, the crystal growth doping method S100 of the present embodiment can also be implemented with other crystal doping apparatuses.

It should be noted that descriptions of the crystal growth doping method S100 is similar to that of the crystal growth doping apparatus 100, and similarities (e.g., the feeding tube 22) between the descriptions of the crystal growth doping method S100 and the crystal growth doping apparatus 100 will not be reiterated herein.

Figure 10:
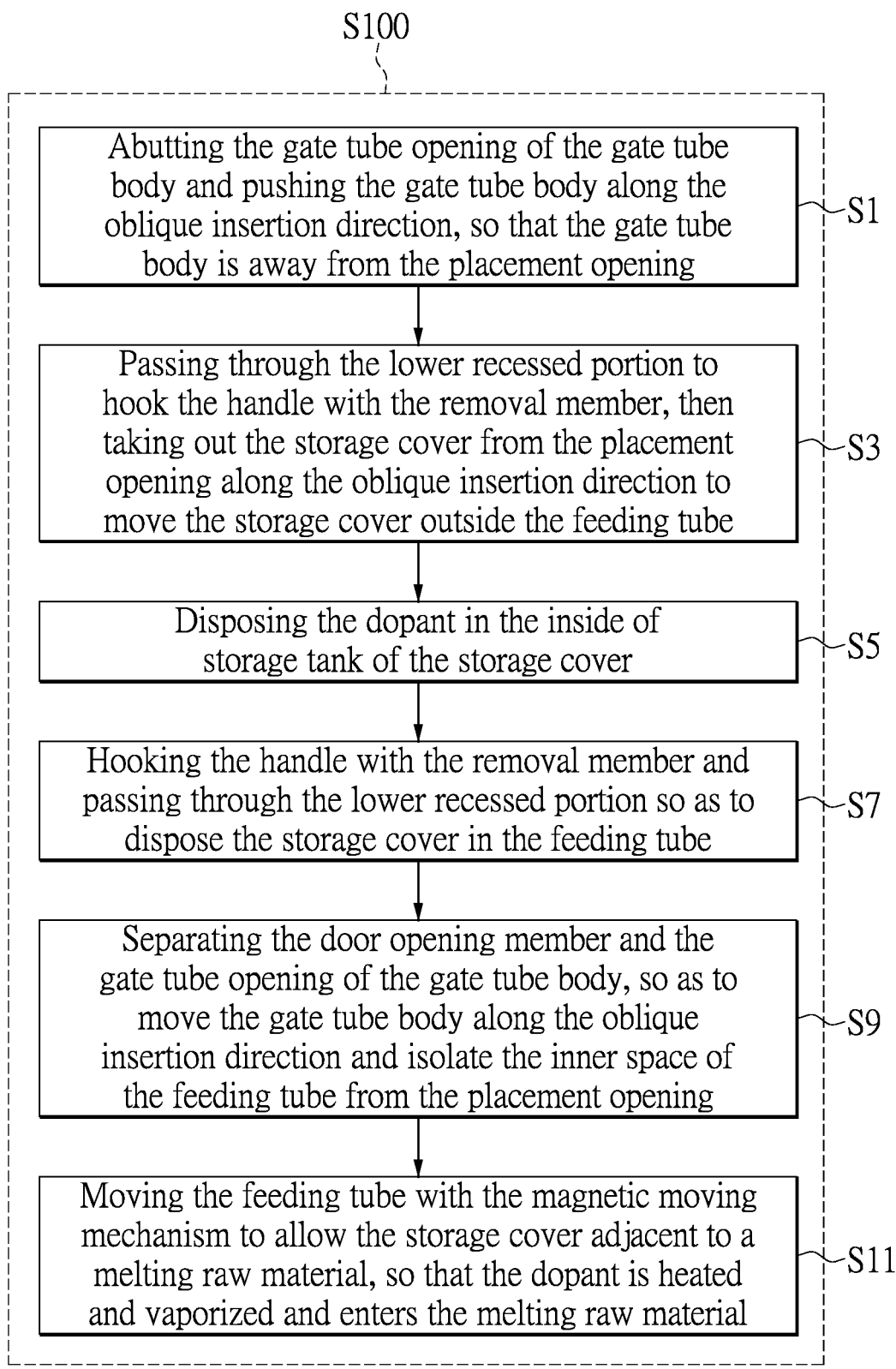
FIG. 10 is a flowchart of a crystal growth doping method according to the embodiment of the present disclosure.

As shown in FIG. 10, the crystal growth doping method S100 sequentially includes a gate opening step S1, a storage cover removing step S3, a material storage step S5, a storage cover placement step S7, a gate closing step S9, and a doping step S11.

As shown in FIG. 10 and FIG. 11, in the gate opening step S1, the door opening member 27 can be used to enter the feeding tube 22 from the placement opening 221 to abut the gate tube opening 241 of the gate tube body 24, and the door opening member 27 can be used to push the gate tube body 24 along the oblique insertion direction F2, so that the gate tube body 24 is moved away from the placement opening 221 of the feeding tube 22. Accordingly, the door opening member 27 engages to the feeding tube 22.

Specifically, in the gate opening step S1, the second rod body 272 of the door opening member 27 enters the gate tube body 24 from the operating tube opening 2121 of the operating tube 212 to detachably abut the gate tube opening 241 of the gate tube body 24 with the second recessed portion 273, then the door opening member 27 pushes the gate tube body 24 along the oblique insertion direction F2 so that the gate tube body 24 is moved away from the placement opening 221.

In continuation of the above, the engagement portion 274 of the door opening member 27 engages to the operating tube opening 2121 of the operating tube 212, so as to maintain a distance between the gate body 24 and the placement opening 221.

As shown in FIG. 10 and FIG. 12, in the storage cover removing step S3, the removal member 26 is configured to pass through the lower recessed portion 2213 of the placement opening 221, the removal member 26 hooks the handle 252 of the storage cover 25, then the storage cover 25 is took outside the feeding tube 22 from the placement opening 221 along the oblique insertion direction F2.

Specifically, in the storage cover removing step S3, the first rod body 262 of the removal member 26 passes through the door opening member 271 to enter the placement opening 221 and then passes through the lower recessed portion 2213, and the removal member 26 hooks and supports the handle 252 with the first recessed portion 263, then the storage cover 25 is took outside of the feeding tube 22 from the placement opening 221 along the oblique insertion direction F2.

As shown in FIG. 7 and FIG. 10, in the material storage step S5, the dopant 300 is placed in the storage tank 251 of the storage cover 25. Specifically, the dopant 300 is placed in the storage tank 251 from the loading opening 253 and through the loading tube 254, and when the dopant 300 is in the storage tank 251, the dopant 300 is disposed between the loading tube 254 and the inner side wall of the storage cover 25. Accordingly, the dopant 300 does not easily fall out of the loading opening 253.

As shown in FIG. 10, in the storage cover placement step S7, the removal member 26 hooks the handle 252 and then passes through the lower recessed portion 2213, so that the storage cover 25 can be placed in the feeding tube 22. In addition, as shown in FIG. 14, when the storage cover 25 is disposed in the feeding tube 22, the side surface of the storage cover 25 and adjacent to the loading opening 253 abuts the flat tube opening 2241.

Figure 13:
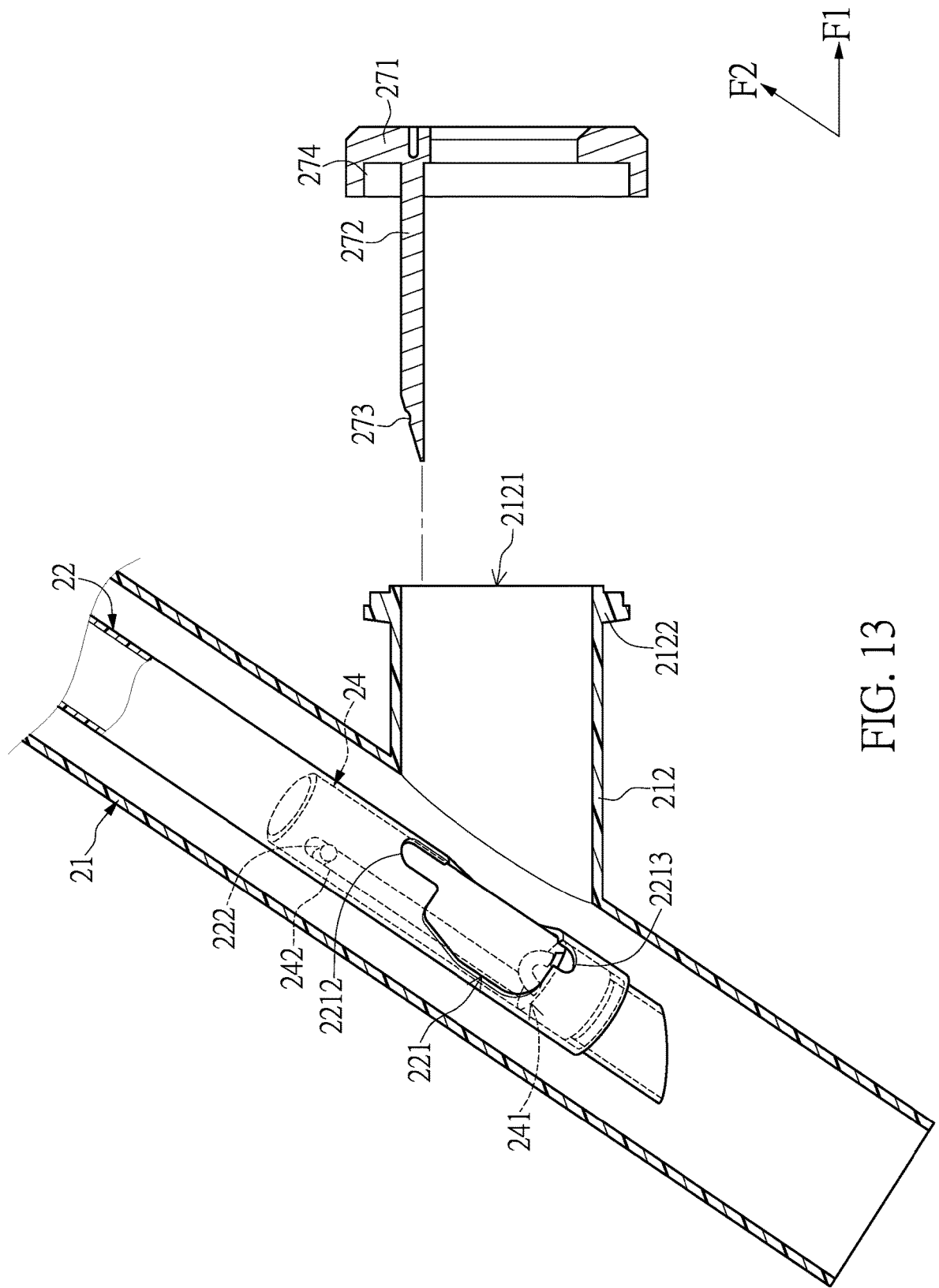
FIG. 13 is a schematic view of a gate closing step according to the embodiment of the present disclosure.

As shown in FIG. 10 and FIG. 13, in the gate closing step S9, the door opening member 27 and the gate tube opening 241 of the gate tube body 24 separate from each other, so that the gate tube body 24 moves along the oblique insertion direction F2 to isolate the inner space of the feeding tube 22 from the placement opening 221.

As shown in FIG. 10 and FIG. 14, in the doping step S11, the magnetic moving mechanism 23 moves the feeding tube 22, so that the storage cover 25 is adjacent to the melting raw material 200. Accordingly, the dopant 300 is heated and vaporized, so as to enter the melting raw material 200.

Beneficial Effects of the Embodiment

In conclusion, in the crystal growth doping apparatus 100 and the crystal growth doping method S100 provided by the present disclosure, by virtue of "a storage cover 25 being detachably disposed in the feeding tube 22, and when the storage cover 25 is disposed in the gate tube body 24, the gate tube body 24 being configured to isolate an inner space of the feeding tube 22 from the placement opening 221," internal pollution problems of the dopant 300 and the crystal growth doping apparatus 100 can be prevented, and when the dopant 300 is took out from or placed in the crystal growth doping apparatus 100, the placement opening 221 of the feeding tube 22 can be prevented from being hit, which may cause the feeding tube 22 to break.

Furthermore, by virtue of "the loading tube 254 being recessed toward an inside of the storage tank 251 from the loading opening 253, and the loading tube 254 and an inner side wall of the storage cover 25 jointly forming the storage tank 251," the dopant 300 does not easily fall out of the loading opening 253.

Furthermore, by virtue of "the shrinkage groove 2211 having two rounded corners 2211a that are formed on two sides thereof along a direction that is perpendicular to the oblique insertion direction F2, and each of the two rounded corners 2211a being between 120° and 180°," the structural strength of the feeding tube 22 can be increased, and the stress that is applied on the feeding tube 22 during operation can be effectively decreased.

Furthermore, by virtue of "the magnetic moving mechanism 23 being configured to move the feeding tube 22," the feeding tube 22 can be operated without opening the crystal growth doping apparatus 100, and problems such as pollution can be prevented.

Furthermore, by virtue of "the placement opening 221 having a shrinkage groove 2211, an upper recessed portion 2212, and a lower recessed portion 2213, and the upper recessed portion 2212 and the lower recessed portion 2213 being connected to the shrinkage groove 2211," when the removal member 26 enters the placement opening 221, sufficient space for movement is provided to the removal member 26, so that the storage cover 25 can be placed in the feeding tube 22 from the shrinkage groove 2211 with the removal member 26 and without the shrinkage groove 2211 being hit.

Furthermore, by virtue of "the ratio of the long groove length 242*a* to the placement port length 221*a* being between 1.3 and 2," when the gate tube body 24 engages to the dowel 222, the gate tube body 24 is configured to isolate the inner space of the feeding tube 22 from the placement opening 221, and when the gate tube body 24 has the long groove 242 formed thereon, the structural strength of the gate tube body 24 still can be maintained to a certain extent.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A crystal growth doping apparatus, comprising:
    a crystal growth furnace including a furnace body and a crucible that is disposed in the furnace body and configured to accommodate a melting raw material; and
    a doping device including:
        a feeding tube inserted to the furnace body along an oblique insertion direction that is inclined relative to a horizontal direction, wherein the feeding tube extends from an outer surface thereof to form a placement opening, and the placement opening is recessed from an edge thereof to form an upper recessed portion and a lower recessed portion along the oblique insertion direction;
        a storage cover detachably disposed in the feeding tube, wherein the storage cover includes a storage tank and a handle formed on an outer surface of the storage tank; and
        a gate tube body disposed in the feeding tube, wherein the storage cover is detachably disposed in the gate tube body, and when the storage cover is disposed in the gate tube body, the gate tube body is configured to isolate an inner space of the feeding tube from the placement opening.

2. The crystal growth doping apparatus according to claim 1, wherein the feeding tube includes a feeding tube opening formed from an end of the feeding tube, and an inclined tube partly disposed in the feeding tube opening, the end being adjacent to the crucible, and wherein the inclined tube has two ends that respectively form a flat tube opening and an inclined tube opening, and the inclined tube opening is parallel to a melting surface of the melting raw material.

3. The crystal growth doping apparatus according to claim 2, wherein the inclined tube opening is adjacent to the melting surface of the melting raw material, the inclined tube opening and the melting surface have a vertical distance there-between, and the vertical distance is not greater than 5 mm.

4. The crystal growth doping apparatus according to claim 2, wherein an outer diameter of the inclined tube is not greater than an inner diameter of the feeding tube, and the flat tube opening is disposed on an inner side surface of the feeding tube opening, and wherein, when the storage cover is disposed in the feeding tube, a side surface of the storage cover that is relatively distant from the handle is detachably disposed on the flat tube opening.

5. The crystal growth doping apparatus according to claim 4, wherein the storage cover further includes a loading opening corresponding in position to the handle and a loading tube that is recessed from the loading opening toward an inside of the storage tank, and a side surface of the storage cover is adjacent to the loading opening and abuts the flat tube opening, and wherein the loading tube and an inner side wall of the storage cover jointly form the storage tank, and the loading opening is configured for a dopant to enter the storage tank.

6. The crystal growth doping apparatus according to claim 1, wherein a shrinkage groove is formed at the placement opening of the feeding tube, and is located between the upper recessed portion and the lower recessed portion.

7. The crystal growth doping apparatus according to claim 1, wherein the gate tube body forms a gate tube opening on an end thereof, and the gate tube opening is recessed along the oblique insertion direction to form a long groove, and wherein, in the oblique insertion direction, the long groove and the placement opening each have a length, and the length of the long groove is not less than the length of the placement opening.

8. The crystal growth doping apparatus according to claim 7, wherein, in the oblique insertion direction, a ratio of the length of the long groove to the length of the placement opening is between 1.3 and 2.

9. The crystal growth doping apparatus according to claim 8, wherein the feeding tube further includes a dowel that is formed on an inner side surface thereof, and the dowel is configured to be disposed in the long groove, and wherein, when the storage cover is disposed in the gate tube body, the dowel engages with an end of the long groove, and the end of the long groove is away from the gate tube opening.

10. The crystal growth doping apparatus according to claim 1, wherein the doping device further includes an outer tube that is disposed on the furnace body along the oblique insertion direction, and the feeding tube is disposed in the outer tube, and wherein the outer tube includes an operating tube that extends along the horizontal direction, and the operating tube has an operating tube opening that is configured for the storage cover to enter an inside of the outer tube from an outside of the crystal growth furnace.

11. The crystal growth doping apparatus according to claim 10, wherein the doping device further includes a removal member having a first rod body and a first recessed portion that is formed on an end of the first rod body, an end of the first rod body is adjacent to the first recessed portion, and the end of the first rod body and a length direction of the first rod body have a first oblique angle there-between, and wherein the removal member is configured to enter the placement opening of the feeding tube from the operating tube opening of the operating tube, and the removal member is configured to take out the storage cover from the feeding tube and hook and support the handle with the first recessed portion.

12. The crystal growth doping apparatus according to claim 10, wherein the doping device further includes a magnetic moving mechanism that is movably mounted on the outer tube, and the feeding tube is disposed at and abuts against an inner side surface of the magnetic moving mechanism, and wherein the magnetic moving mechanism is configured to move the feeding tube.

13. The crystal growth doping apparatus according to claim 12, wherein the magnetic moving mechanism further includes an outer magnetic sleeve that is movably disposed on an outer surface of the outer tube, an inner magnetic sleeve that is movably disposed on an inner side surface of the outer tube, a plurality of attracted members that are movably disposed between the inner side surface of the outer tube and the inner magnetic sleeve, and a plurality of magnetic members that are disposed on a side surface of the outer magnetic sleeve, and the side surface of the outer magnetic sleeve is away from the outer surface of the outer tube, and wherein the adsorbed members correspond in position to the magnetic members.

14. The crystal growth doping apparatus according to claim 10, wherein the doping device further includes a door opening member including a second rod body and a second recessed portion that is formed on an end of the second rod body, the end of the second rod body is adjacent to the second recessed portion, and the end of the second rod body and a length direction of the second rod body have a second bevel angle there-between, wherein the door opening member is configured to enter the gate tube body from the operating tube opening of the operating tube to detachably abut an opening of the gate tube body with the second recessed portion, and wherein the door opening member is configured to push the gate tube body along the oblique insertion direction so that the gate tube body is moved away from the placement opening.

15. The crystal growth doping apparatus according to claim 14, wherein the door opening member further includes an engagement portion that is located on another end of the door opening member, and the another end of the door opening member is relatively distant from the second recessed portion, and wherein, after the door opening member pushes the gate tube body to move away from the placement opening, the engagement portion is configured to engage with the operating tube opening of the operating tube, so as to maintain a distance between the gate tube body and the placement opening.

16. A crystal growth doping method configured to be implemented with a doping device that is inserted in a crystal growth furnace along an oblique insertion direction, wherein the crystal growth furnace includes a crucible therein, and the crucible is configured to accommodate a melting raw material, and wherein the doping device includes a feeding tube, a gate tube body that is disposed in the feeding tube, and a storage cover that is detachably disposed in the gate tube body, and the feeding tube extends from an outer surface thereof to form a placement opening, the crystal growth doping method comprising:
- a gate opening step: having a door opening member enter the feeding tube from the placement opening and abut against a gate tube opening of the gate tube body, the door opening member pushing the gate tube body along the oblique insertion direction such that the gate tube body is moved away from the placement opening of the feeding tube, and having the door opening member engage with the feeding tube;
- a storage cover removing step: having a removal member pass through the placement opening so as to hook a handle of the storage cover onto the removal member, and taking the storage cover outside of the feeding tube from the placement opening along the oblique insertion direction;
- a material storage step: placing a dopant in the storage cover;
- a storage cover placement step: hooking the handle and placing the storage cover into the feeding tube with the removal member;
- a gate closing step: separating the door opening member from the gate tube opening of the gate tube body, so as to move the gate tube body along the oblique insertion direction and isolate an inner space of the feeding tube from the placement opening; and
- a doping step: moving the feeding tube to allow the storage cover to be adjacent to the melting raw material, so that the dopant is heated and vaporized and enters the melting raw material.

* * * * *